United States Patent [19]

Ellsworth et al.

[11] Patent Number: 4,651,409

[45] Date of Patent: Mar. 24, 1987

[54] METHOD OF FABRICATING A HIGH DENSITY, LOW POWER, MERGED VERTICAL FUSE/BIPOLAR TRANSISTOR

[75] Inventors: Daniel L. Ellsworth; Paul A. Sullivan, both of Fort Collins, Colo.

[73] Assignee: NCR Corporation, Dayton, Ohio

[21] Appl. No.: 771,855

[22] Filed: Sep. 3, 1985

Related U.S. Application Data

[62] Division of Ser. No. 578,333, Feb. 9, 1984, abandoned.

[51] Int. Cl.⁴ .............................................. H01L 21/20
[52] U.S. Cl. ...................................... 29/576 B; 29/578; 29/576 C; 148/1.5; 148/DIG. 55; 365/104
[58] Field of Search .................. 29/576 B, 578, 576 C; 148/1.5, DIG. 55; 156/644; 427/93; 357/2, 0.4, 51, 52, 59; 365/96, 104

[56] References Cited

U.S. PATENT DOCUMENTS

| | | | |
|---|---|---|---|
| 3,570,114 | 3/1971 | Bean et al. | 29/577 R |
| 3,717,852 | 2/1973 | Abbas et al. | 365/103 |
| 3,980,505 | 9/1976 | Buckley | 148/1.5 |
| 4,146,902 | 3/1979 | Tanimoto et al. | 357/6 |
| 4,287,569 | 9/1981 | Fukushima | 365/96 |
| 4,403,399 | 9/1983 | Taylor | 29/574 |
| 4,412,378 | 11/1983 | Shinada | 29/578 |
| 4,420,766 | 12/1983 | Kasten | 357/59 |
| 4,424,578 | 1/1984 | Miyamoto | 365/104 |
| 4,441,167 | 4/1984 | Principi | 365/94 |
| 4,488,262 | 12/1984 | Basire et al. | 365/104 |
| 4,489,481 | 12/1984 | Jones | 29/591 |
| 4,569,122 | 2/1986 | Chan | 29/577 C |
| 4,590,589 | 5/1986 | Gerzberg | 365/100 |

OTHER PUBLICATIONS

Tanimoto et al, "A Novel MOSPROM Using a Highly Resistive Poly-Si Resistor", IEEE Transactions on Electron Devices, vol. ED 27, No. 2, Mar. 1980.

Colclaser, Micro-Electronics Processing and Device Design, John Wiley & Sons, 1980, New York, pp. 84–100.

"Fijitsu Comes Out with Fastest 64K PROM", Electronic Engineering Times, Monday, Dec. 6, 1982, p. 10.

Primary Examiner—Upendra Roy
Assistant Examiner—John T. Callahan
Attorney, Agent, or Firm—J. T. Cavender; Casimer K. Salys

[57] ABSTRACT

A fuse programmable ROM includes a wafer for a CMOS-type structure having an emitter, which emitter is overlain by a fuse pad of an undoped polysilicon and a conductive layer. There is a layer of barrier oxide disposed on the conductive top layer of the fuse pad and a sidewall oxide surrounding the periphery of the fuse pad both of which are overlain by the metallic electrical connection.

The process of producing the fuse programmable ROM includes wide utilization of standard CMOS fabrication techniques with which are included the steps of depositing fuse material of undoped polysilicon, forming the fuse material into a fuse pad, and then making an electrical connection with the fuse pad.

3 Claims, 9 Drawing Figures

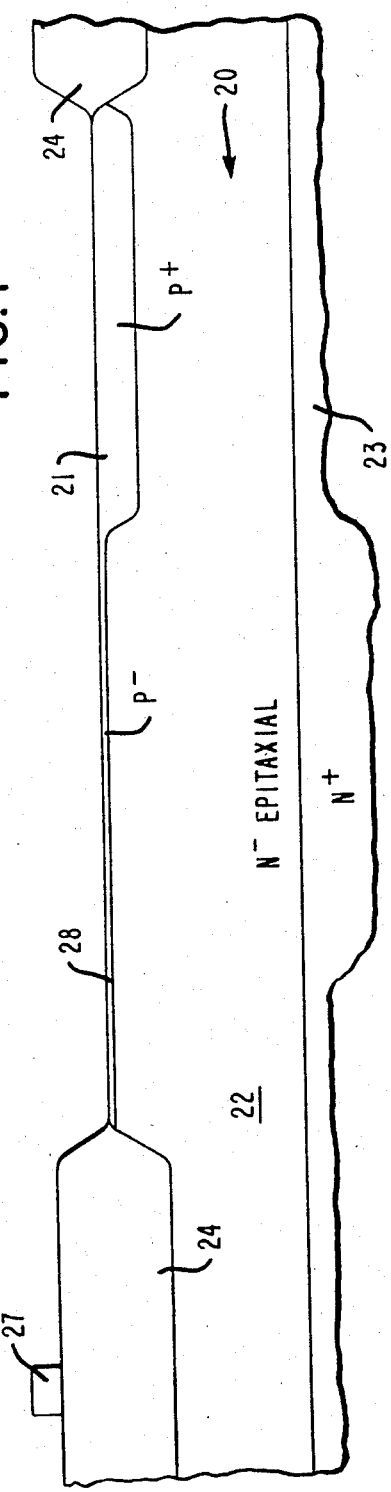
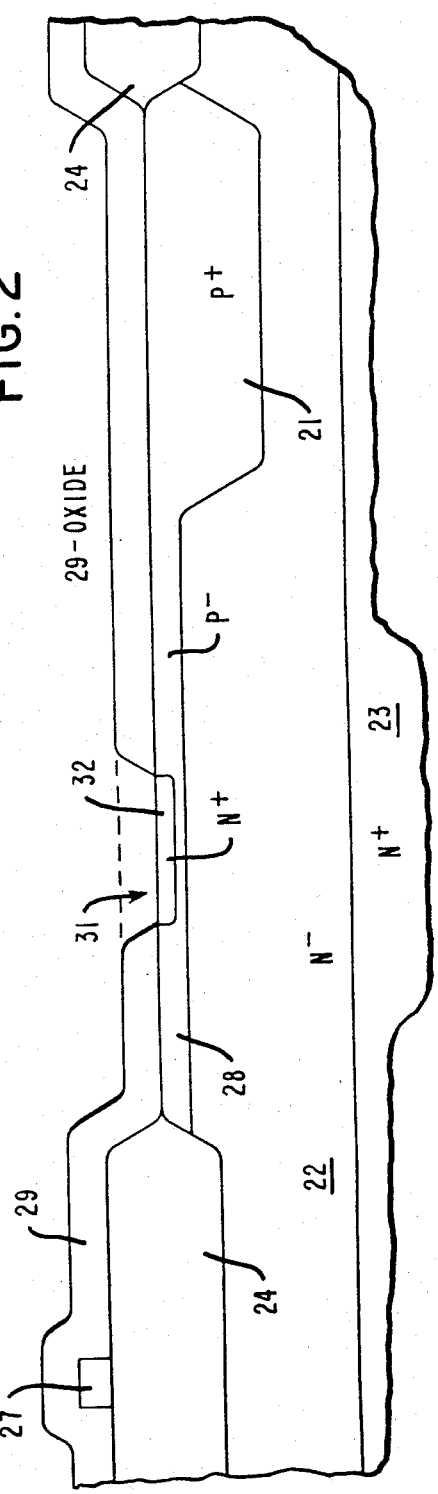

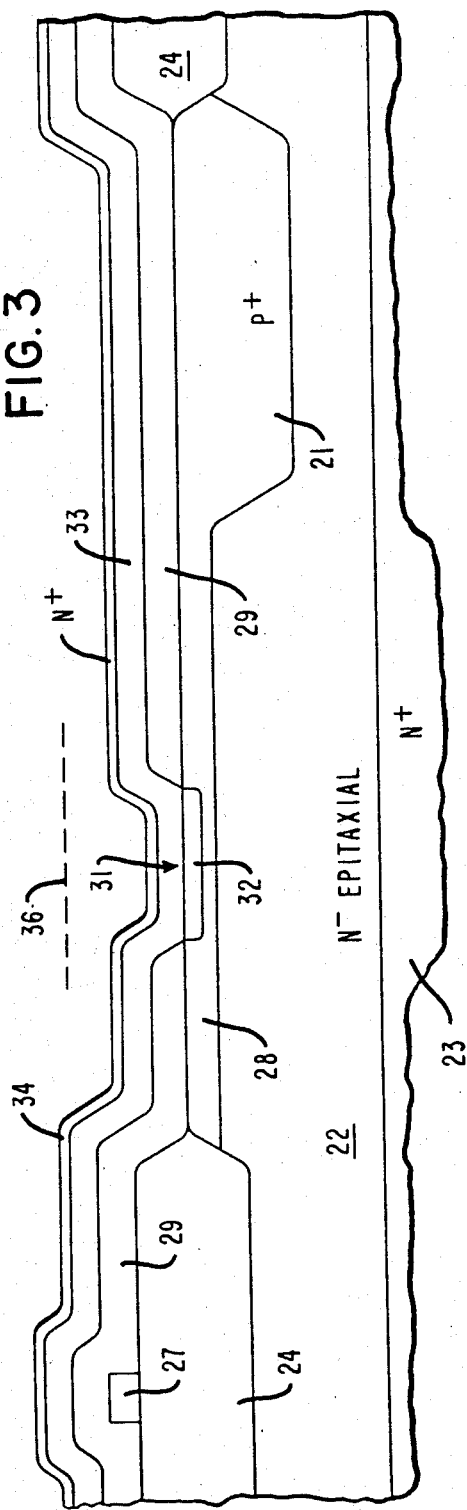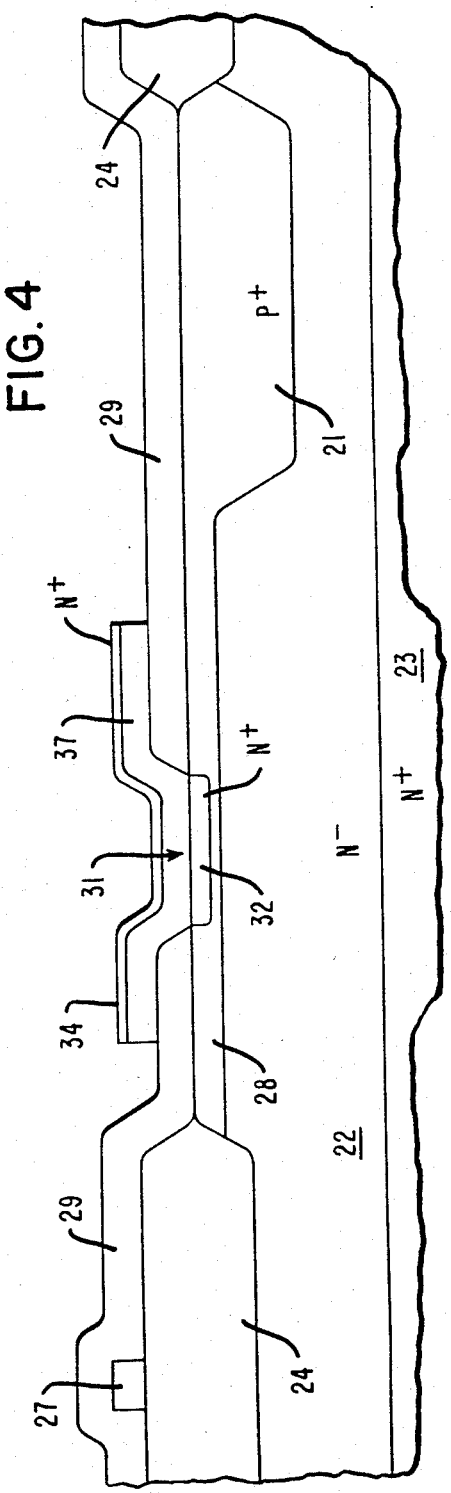

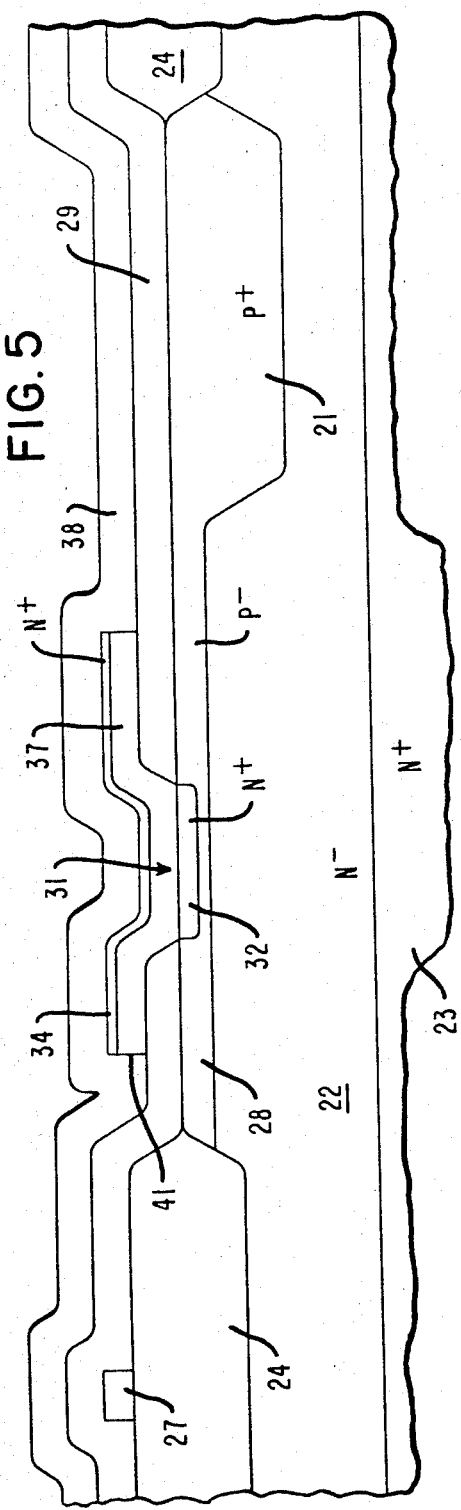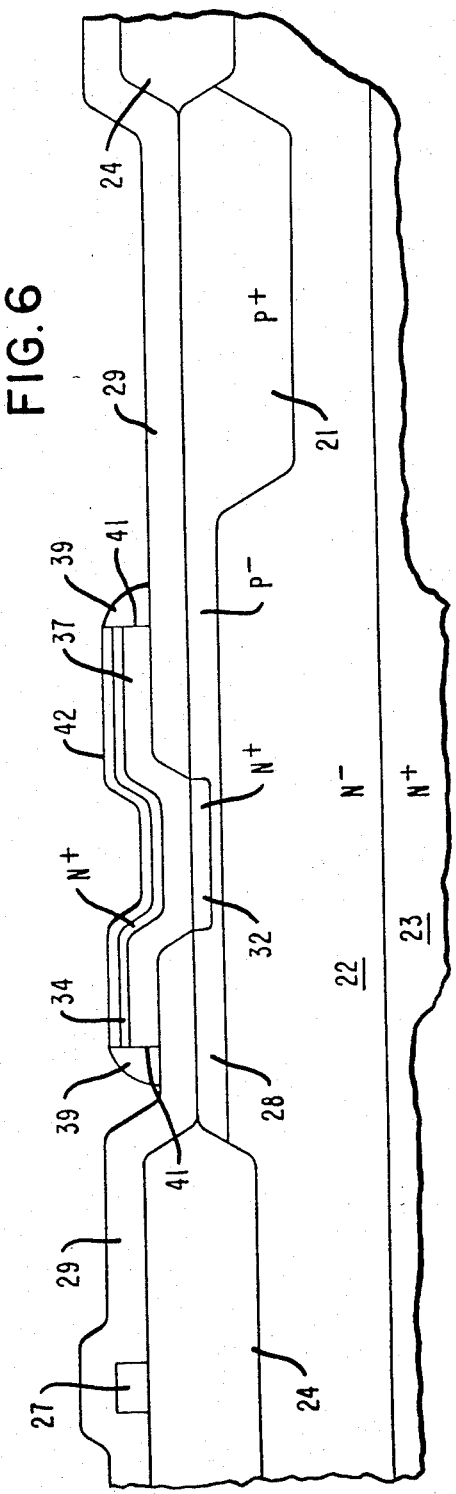

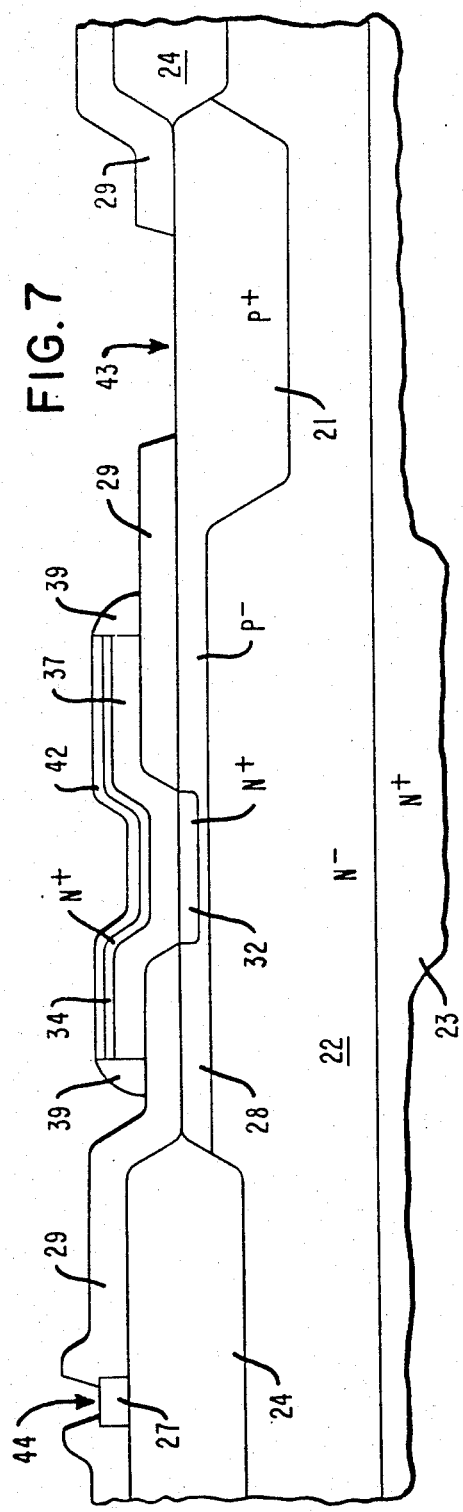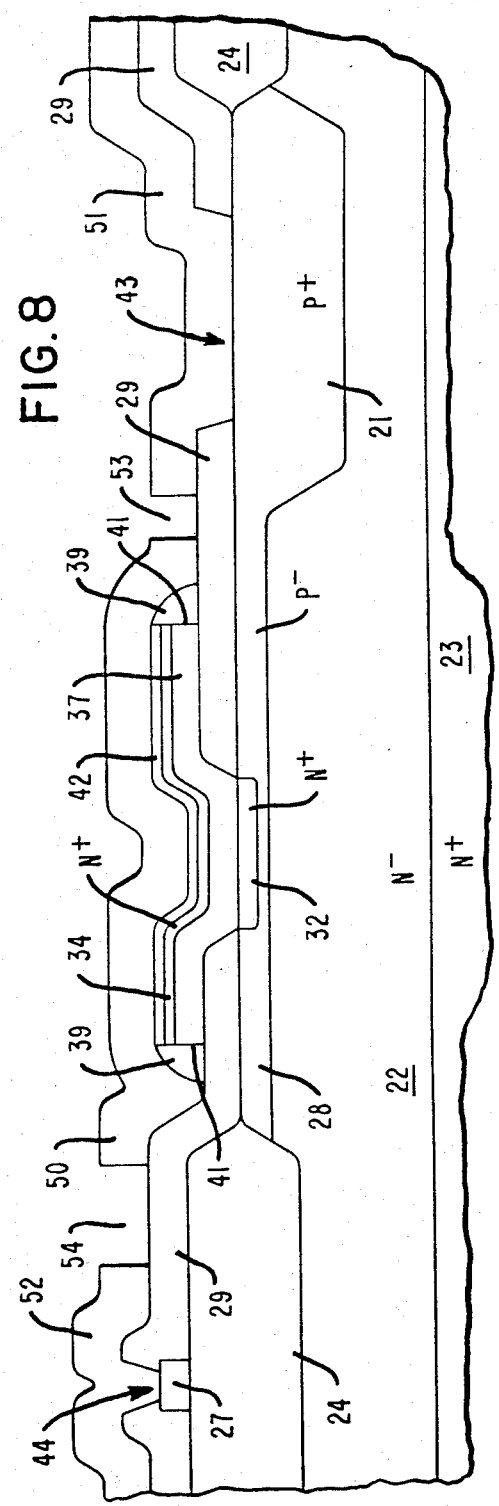

METHOD OF FABRICATING A HIGH DENSITY, LOW POWER, MERGED VERTICAL FUSE/BIPOLAR TRANSISTOR

This application is a division of application Ser. No. 578,333, filed Feb. 9, 1984, now abandoned.

BACKGROUND OF THE INVENTION

1. Field of the Invention

The instant invention relates to electrically programmable read only memories (PROM's), and more particularly, the instant invention relates to PROM's which use a vertical fuse technique and to processes for their manufacture.

2. Prior Art and Technical Considerations

There are two general types of PROM devices, i.e., the irreversible fuse-link programming device and the trapped-charge device, generally referred to as an erasable PROM or EPROM. With the erasable PROM, the trapped charges are removed by exposing the integrated circuit chip to an erase voltage or an ultraviolet light. Memory is maintained by a charge stored in an isolated conductor or by a charge held in deep trap states, such as may exist at the interface of dielectric heterostructures. However, while such EPROMs may be erased and reprogrammed, they require a high programming voltage and must maintain extremely rigid dielectric quality standards in order to retain information for a commercially acceptable period of time, which is perhaps ten years. In EPROM devices, considerable manufacturing testing must be utilized to insure that the charges are actually retained and that the devices are reliable. This additional testing contributes greatly to the cost of trapped-charge memories. PROM's utilizing irreversible, fuse programming techniques have demonstrated better retention periods than EPROMs but heretofore have been even more expensive to fabricate than EPROMS. In many cases, the most important factor is the cost per bit for a user programmable medium.

While it has been generally recognized that fuse-type PROMs potentially have advantages in reliability over trapped-charge devices, the prior art in this area has been unsuitable for low cost applications. Until very recently, fuse type PROMs have been manufactured utilizing bipolar processes. However, bipolar manufacturing processes are expensive, and the resulting devices are of low density and consequently higher cost. Moreover, the peripheral circuitry necessary for bipolar devices consume a lot of power. This has, in most instances, made fuse devices less desirable than their metal oxide silicon (MOS) trapped-charge counterparts. An exception to this is where long term reliability and high speed are required, since bipolar structures have memory-read access times five times faster than MOS structures.

Early bipolar PROM devices consisted of a simple diode/fuse arrays with bipolar peripheral transistors. These transistors could supply sufficient current and voltage to open-circuit selected fuses for programming. While this approach achieves high density, because of the simplicity of diode fabrication, it is not well suited to large memory arrays since it requires the fabrication of two levels of high current conductors traversing the long distances present in VLSI memory layouts. The presence of an active, high gain device at each node of the memory array will reduce the stringent current-carrying requirements for a level of the interconnect and has therefore been generally adopted by manufacturers of higher density PROMs.

The need for an inexpensive, high density, programmable ROM has resulted in several innovations in active array, fuse-type PROM devices. The SEMICONDUCTOR CMOS DIGITAL PRODUCTS DIVISION of the Harris Corporation has built a PROM part (HM 6641) utilizing CMOS technology which avoids the power-intensive nature of the peripheral circuitry necessary with bipolar devices. In their technique, lateral polysilicon fuses are connected to separate NPN bipolar transistors in the array, thus gaining the advantages of a CMOS process while maintaining the fuse-blowing power of bipolar devices. However, their devices are essentially low density devices, because they utilize lateral fuses which are placed adjacent to their bipolar transistors. In addition to low density, the Harris devices have the disadvantage of the need for an opening in the passivation layer to allow the expulsion of the blown fuse material. These holes in the passivation layer result in an inherent reduction in reliability.

Another example of recent PROM technology is exemplified by the article "Fujitsu Comes Out with Fastest 64K PROM", Electronic Engineering Times, Dec. 6, 1982, Page 10. The designers in that situation utilize a completely vertical configuration, but do so at the expense of bipolar technology. This approach is further discussed in an article by Dave Burskey, Ed., "Isolation Process and DEAP Technique Cut PROM Access Time", Electronic Design, Vol. 27, No. 14, July 5, 1979. DEAP is an acronym for "Diffused Eutectic Aluminum Process". In essence the Fujitsu designed DEAP programming technique utilizes an aluminum and polysilicon layer sitting on top of an emitter-base blocking diode. During programming, a reverse current is applied to the emitter surface to diffuse aluminum-silicon eutectic down through the emitter-base blocking diode junction. This shorts the junction. The Fujitsu arrangement utilizes a functional PNP transistor for a program device, while unprogrammed devices remain as four-layer NPNP devices to block current flow. While the Fujitsu process has the advantages of increased density due to a vertical fuse stacked on top of an active device, the Fujitsu process requires full isolation bipolar technology and uses bipolar transistors for peripheral circuitry. The resulting structure is expensive to fabricate and has a high level of power consumption.

An improved bipolar PROM with a similar vertical blocking diode which is shorted during programming has been described in U.S. Pat. No. 4,403,399 by Taylor. This invention discloses a vertical diode/bipolar transistor structure which does not require device isolation and therefore may have improved density over the Fujitsu DEAP technology. However, this device is programmed by creating an extremely high power density region in a thin epitaxial layer to induce migration of aluminum particles, therefore shorting the blocking diode junction. The bipolar devices in the array provide some current gain but their effectiveness is degraded by the high programming currents required to short the blocking diode junction since the bipolar transistor gain is low at such high current. Greater current could be obtained from the bipolar transistor by increasing the emitter area; however, because the size of the blocking diode is determined by the emitter size a larger diode requires a proportionately larger programming current.

For this configuration, most of the programming current must be supplied as base current to the bipolar transistors from the peripheral circuitry. Therefore, this device is best built in a bipolar process with bipolar peripheral circuitry and two levels of low resistivity interconnect.

Another approach is set forth in an article by Tanamoto et al., "A Novel MOS PROM Using Highly Resistive Polysilicon Resistor", IEEE Transactions on Electron Devices, Vol. ED-27, No. 3, Pages 517-520, March, 1980. This PROM utilizes a vertical anti-fuse structure and contains only MOS circuitry. The anti-fuse consists of high resistivity polysilicon which undergoes a dramatic decrease in resistivity upon application of sufficient voltage and current. The current required to lower the resistivity of the polysilicon is much lower than required to short the blocking diode in the devices described above. The current is lower because a different physical mechanism is employed, i.e. a memory switching phenomenon which is characteristic of polysilicon and calcogenide glasses. This phenomenon has been studied and described by Mahan in Applied Physics Letters Vol. 41, p. 479, Sept. 1, 1982. Consequently, it is feasible to make such a PROM in an MOS process and gain the advantage of low power consumption, lower cost and reduced process complexity. Since this approach utilizes a vertical anti-fuse, the lateral area consumed by each bit is reduced when compared to a lateral fuse. With this approach, however, a MOS transistor is required at each bit in the array. The MOS transistor used with each cell is an inherently lateral device adjacent to the fuse which lowers the density of the entire structure, even though the fuse is vertical.

In view of the deficiencies of the prior art, there remained a need for high density, fuse type PROMs which require low programming power, are low in manufacturing cost and reliable as to the data entered.

SUMMARY OF THE INVENTION

In view of the aforementioned considerations, it is an objective of our invention to provide a new and improved PROM with a high density, merged, vertical fuse/bipolar transistor and to produce that PROM utilizing CMOS process technology to achieve a low cost PROM with low power consumption and high reliability.

Pursuant the foregoing features, the instant invention contemplates a process of fabricating PROMs wherein a wafer for a CMOS type structure is provided having an exposed emitter contact of one conductivity type juxtaposed by a layer of field oxide and a base contact area of an opposite conductivity. A layer of undoped polysilicon is then formed over the exposed emitter and over all adjacent areas of oxide. A conductive layer having a conductivity similar to that of the emitter is then formed on the polysilicon. The polysilicon is then patterned to leave pads over the emitter and immediately adjacent oxide area. A metallic electrical connection is made with the conductive layer to provide a vertical anti-fuse structure in conjunction with the bipolar device.

The instant invention further contemplates forming a layer of protective oxide around the exposed peripheral edge of the fuse pad and forming a barrier oxide over the conductive layer on the fuse pad before forming the metallic electrical connections.

In addition, the invention contemplates a PROM memory cell which has been fabricated in accordance with the aforedescribed steps wherein a vertical anti-fuse is disposed between the emitter and electrical connection.

BRIEF DESCRIPTION OF THE DRAWINGS

FIGS. 1-8 are cross-sectional representations of an integrated circuit element showing the steps utilized in fabricating a single memory cell in an array of similar memory cells in accordance with a first embodiment of the invention.

DESCRIPTION OF THE PREFERRED EMBODIMENT

Figure 9:
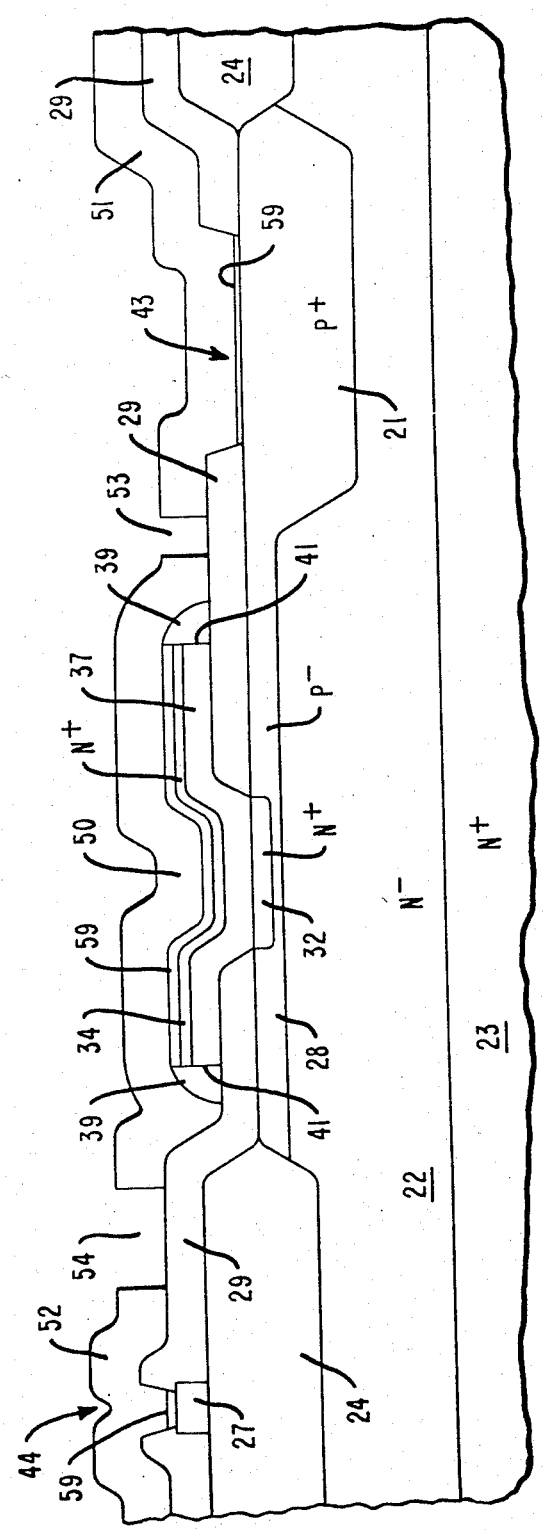
FIG. 9 is a cross-sectional representation of another embodiment of the invention.

The instant invention takes advantage of the previously developed bipolar-CMOS processes, such as that set forth in U.S. Pat. No. 4,507,847, entitled "Bipolar CMOS Process and Structure" invented by Paul A. Sullivan, assigned to the same assignee as the instant invention and incorporated herein by reference. In essence, according to the instant invention the CMOS bipolar process described in that patent application is modified to fabricate a vertical polysilicon anti-fuse structure which is merged with a self-aligned emitter. The exemplary process features silicon wafers of one conductivity type, i.e. n− type, wells of the opposite conductivity type, i.e. p− wells, and vertical NPN devices fabricated in n− type substrate regions.

In accordance with the instant invention, the PROM includes an array of cells, each having an emitter follower and a pad of semiconductor material which serves as an anti-fuse and constitutes the programmable element. For purposes of clarity, only a single cell is shown in the figures.

Referring now to FIG. 1, there is shown a wafer, designated generally by the numeral 20, which has been previously processed in accordance with the CMOS processes of the aforementioned U.S. Pat. No. 4,507,847 to provide a p+ base contact region 21 in an n− epitaxial layer 22, which has been grown on n+ bulk material 23 of the wafer. A field oxide layer 24 covering wafer 20 is disposed on top of the n− epitaxial layer 22 and in juxtaposition to the base contact region 21. A doped and patterned polysilicon interconnect electrode 27 is shown to be formed on top of the field oxide layer 24.

The aforedescribed structure includes the steps in the aforementioned U.S. Pat. No. 4,507,847, through the arsenic (n+) source/drain implant, anneal and drive-in steps.

A blanket base ion implant step is then performed to provide a p− active base region 28. The wafer is then annealed (to remove implant damage) at a temperature of about 950 degrees C. for about one hour. This diffuses base region 28 to a depth of about 0.5 microns. The surface of the wafer 20 is then masked to expose only the p+ base contact area, region 21, and the p+ source/drain regions (not shown). These regions are then doped with boron in accordance with standard procedures and annealed.

As is seen in FIG. 2, a layer of oxide 29 is deposited over the entire surface of the wafer. The oxide layer is then photolithographically masked so as to expose only the area 31 of the p− active base region 28 where the emitter is to be formed. The oxide 29 is then etched in accordance with conventional practice down to the surface of active base region 28 to define the emitter contact area 31 on the active base region. Unlike other bipolar processes, areas of contact to other structures, such as the polysilicon 27 and base contact region 21, are not open at this point in the process. The emitter contact area 31 on the active base region 28 is then implanted with arsenic, using a dose of about $5 \times 10^{15}$ ions/cm$^2$ at about 80 KeV. Upon annealing the wafer with approximately 920 degrees C. for approximately 30 minutes, a diffused emitter 32 which is approximately 0.25 microns deep is formed in the active base region 28.

Referring now to FIG. 3, the fuse material is applied by depositing a layer of undoped polysilicon 33 to a thickness of approximately 0.5 microns over the entire surface of the wafer 20. The surface of the undoped polysilicon layer 33 is then implant-doped with arsenic, using a dose of about $10^{15}$ ions/cm$^2$ at about 40 KeV to form an n+ conductive layer 34 approximately 0.25 microns thick. An area 36 over the emitter contact area 31 is then photolithographically masked, and the exposed portion of the polysilicon layer is etched away to leave a pad 37 of polysilicon, as is seen in FIG. 4.

As is seen in FIG. 5, approximately 0.5 microns of silicon dioxide 38 may then be deposited uniformly over the entire wafer 20 in order to protect the edges of pad 37. The layer of silicon dioxide 38 is then etched away utilizing an anisotropic dry plasma etch applied normally with respect to the wafer 20, which leaves a deposit of oxide 39 in abutment with the peripheral edge 41 of the pad 37 (see FIG. 6). This phenomenon results because the oxide layer 38 in the region adjacent to the edge of pad 37 is twice as thick as the oxide elsewhere. Since the oxide is not laterally etched, the deposit 39 remains after the etch. This sidewall oxide is not essential to the invention but may be a desirable process step for improved device integrity and yield.

The wafer 10 is then annealed at a low temperature for a short period of time in an oxidizing ambient in order to grow approximately 100 Angstroms of oxide on the doped poly 34 to form a contact barrier oxide layer 42 (see FIG. 6). This short low temperature anneal forms the oxide layer 42 without causing excessive diffusion of arsenic from layer 34 into the adjacent layer 37. An appropriate anneal may be for two hours at 750 degrees C., with the first several minutes being performed in an oxidizing atmosphere.

Referring now to FIG. 7, subsequent to the annealing step, standard CMOS processing, as set forth in U.S. Pat. No. 4,507,847, is used to penetrate the oxide layer 29 and open contact areas 43 and 44 to the base contact region 21 and polysilicon interconnect 27, respectively. Contacts are also opened to CMOS device p+ and n+ diffused regions not shown in this figure.

Referring to FIG. 8, electrical connections 50, 51 and 52 are made with the fuse pad 37, base contact region 21 and polysilicon interconnect 27, respectively, by depositing a layer of metal over the wafer 20 and etching unwanted metal away from areas 53 and 54 to separate the desired connections using standard photolithographic techniques. The thin oxide barrier layer 42 between the contact 50 and the polysilicon fuse pad 37 stabilizes the low temperature annealed fuse to minimize any metal dissolution reaction during alloying of the contacts 51 and 52.

Referring now to FIG. 9, in accordance with another embodiment of the invention, after the step of FIG. 7, oxide layer 42 is removed and a layer 59 of tungsten is deposited selectively on the fuse pad 37 (with or without the sidewall oxide 39) and on the contact surfaces 43 and 44 of the base 21 and interconnect 27, respectively.

The 250 to 1000 Angstroms thick tungsten layer 59 provides a contact barrier layer for subsequent metalization using 50, 51 and 52.

After the wafer 20 is completed, a passivation layer is deposited. However, openings in the passivation layer over vertical anti-fuse areas are not required, (as in devices with lateral polysilicon fuses), since during programming of this PROM no material is expelled from the fuse pads 37.

The aforedescribed process provides a merged, vertical fuse/bipolar transistor in conjunction with state-of-the-art CMOS devices. The undoped polysilicon layer 37 functions as an "anti-fuse" which is stacked on the emitter 32 of a common collector NPN bipolar transistor to form a unique, high density, electrically programmable single transistor memory cell. The vertical, stacked configuration of the memory cell is provided while still obtaining the cost effectiveness and power advantages of CMOS peripheral circuitry.

With reference to the embodiment in FIG. 8 of the drawings, the anti-fuse is programmed by forming a conductive path between metal interconnect 50 and diffuse emitter 32 through the application of appropriate voltages to the NPN bipolar transistor. For example, the nominal resistance of several megohms between diffused emitter 32 and interconnect 50 can be reduced to the range of several thousand ohms by applying a current of one to three milliamps for a period of one to two microseconds. These programming conditions are imposed on the device in FIG. 8 by connecting a nominal 13 volt bias to collector region 22, grounding interconnect metal 50 and applying a nominal 13 volts to diffused base 21 by way of metal 51. To constrain the magnitude of the current through the NPN transistor, the base current is limited to approximately 100 microamps.

Though the exact mechanism by which the conductive path is formed between diffused emitter 32 and metal 50 is not fully understood, it is known that the polysilicon layer 37 undergoes two changes. First, the grain structure of the polysilicon in the region above diffused emitter 32 is reformed during programming to one of larger individual grains. Secondly, n-type dopant diffuses from emitter region 32 and doped polysilicon 34 to form a conductive path through formerly undoped polysilicon 37. The silicon dioxide of interfacial barrier oxide layer 42 has minimal effect on the programming of the anti-fuse because of its low dielectric integrity and the asperities on the upper surface of polycrystalline silicon 34. Note that in the alternate embodiment, depicted in FIG. 9, that the interfacial barrier oxide layer 42 is completely omitted.

The foregoing illustrations and examples are merely illustrative of the invention which is to be limited only by the following claims.

We claim:

1. A process of fabricating at least one electrically programmable read only memory element comprising the steps of:

forming a wafer for CMOS-type structures having a polysilicon gate and having a first conductivity type base contact region in a second conductivity type epitaxial layer, the first conductivity type base contact region being juxtaposed to a field oxide layer which partially overlies the second conductivity type region;

forming an active first conductivity type base region extending to the first conductivity type base contact region by blanket implantation;

depositing a layer of isolation oxide over the wafer;

masking the isolation oxide except in an area over the active base region;

etching the isolation oxide exposed by the masking down to the first conductivity type active base region to define an emitter contact area on the active base region;

doping the emitter contact area with second conductivity type impurity;

annealing the wafer to form a second conductivity type diffused emitter;

depositing an undoped polysilicon layer over the second conductivity type diffused emitter;

forming a second conductivity type doped polysilicon layer one the exposed surface of the polysilicon layer;

masking the polysilicon layer except in the areas over and adjacent to the emitter contact area and etching the unmasked areas to form a fuse pad of the undoped polysilicon covering the emitter contact areas and having a periphery overlying the isolation oxide;

providing an interfacial barrier layer on the surface of the fuse pad;

opening contact areas to the first conductivity type base contact region;

depositing metal over the fuse pad and contact areas to form electrical connections for the memory element; and passifying the resulting element.

2. The process of claim 1 wherein the step of providing the interfacial barrier layer is comprised of forming a layer of tungsten which is selectively deposited on the fuse pad and the first conductivity type base contact region immediately prior to depositing metal to form the electrical connections therewith.

3. The process recited in claim 2, further including after the step of masking and etching the polysilicon layer the additional step of depositing a layer of silicon dioxide over the entire wafer and etching the layer of silicon dioxide away to leave a protective deposit of silicon dioxide in abutment with the periphery of the fuse pad.

* * * * *